US012624446B2

(12) United States Patent
Mustafa et al.

(10) Patent No.: US 12,624,446 B2
(45) Date of Patent: May 12, 2026

(54) PUMPING LINERS WITH SELF-ADJUSTING PUMPING CONDUCTANCE

(71) Applicant: Applied Materials, Inc., Santa Clara, CA (US)

(72) Inventors: Muhannad Mustafa, Milpitas, CA (US); Muhammad M. Rasheed, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 17/739,843

(22) Filed: May 9, 2022

(65) Prior Publication Data

US 2022/0356572 A1     Nov. 10, 2022

Related U.S. Application Data

(60) Provisional application No. 63/186,162, filed on May 9, 2021.

(51) Int. Cl.
| | |
|---|---|
| *C23C 16/44* | (2006.01) |
| *C23C 16/455* | (2006.01) |
| *C23C 16/458* | (2006.01) |
| *H10P 72/00* | (2026.01) |

(52) U.S. Cl.
CPC .... *C23C 16/4412* (2013.01); *C23C 16/45557* (2013.01); *C23C 16/45589* (2013.01); *C23C 16/4585* (2013.01); *H10P 72/0402* (2026.01)

(58) Field of Classification Search
CPC .......... C23C 16/4412; C23C 16/45506; C23C 16/45508; C23C 16/4558; C23C 16/45589; C23C 16/45591; C23C 16/45557; C23C 16/4585; H01J 37/3244; H01J 37/32449; H01J 37/32495; H01J 37/32834; C30B 25/14; C30B 25/165; H01L 21/6719; F16K 15/025; F16K 15/026; H10P 72/0402
See application file for complete search history.

(56) References Cited

U.S. PATENT DOCUMENTS

| | | | |
|---|---|---|---|
| 1,710,635 A * | 4/1929 | Wertz | F16K 15/026 |
| | | | 137/220 |
| 5,964,947 A | 10/1999 | Zhao et al. | |
| 9,490,149 B2 * | 11/2016 | Chandrasekharan | |
| | | | C23C 16/45523 |
| 9,490,152 B2 | 11/2016 | Wang et al. | |
| 9,953,849 B2 * | 4/2018 | Suuronen | H01L 21/6875 |
| 10,669,625 B2 | 6/2020 | Liu et al. | |
| 2005/0150452 A1 | 7/2005 | Sen et al. | |
| 2010/0108263 A1 | 5/2010 | Nguyen et al. | |
| 2017/0138493 A1 * | 5/2017 | Yamaguchi | F16K 27/0209 |
| 2017/0306491 A1 * | 10/2017 | Liang | C23C 16/45502 |

(Continued)

FOREIGN PATENT DOCUMENTS

WO          2016178754 A1     11/2016

*Primary Examiner* — Kurt Sweely
(74) *Attorney, Agent, or Firm* — Servilla Whitney LLC

(57) ABSTRACT

Pump liners and process chambers with the pump liners are described. The pump liner has a ring-shaped body with an annular wall enclosing a process region. A plurality of circumferentially spaced openings provide fluid communication through the annular wall between the process region and a region outside of the ring-shaped body. Each of the plurality of circumferentially spaced openings has a self-adjusting valve assembly. Self-adjusting valves and processing methods are also described.

16 Claims, 5 Drawing Sheets

(56) References Cited

U.S. PATENT DOCUMENTS

| 2019/0338420 | A1 | 11/2019 | Srivastava |
| 2020/0234989 | A1* | 7/2020 | Jeong ................ H01L 21/67017 |
| 2020/0377998 | A1 | 12/2020 | Mustafa et al. |
| 2020/0378402 | A1 | 12/2020 | Mustafa et al. |
| 2021/0079524 | A1 | 3/2021 | Yang et al. |
| 2022/0084845 | A1 | 3/2022 | Subramanya et al. |
| 2022/0119948 | A1 | 4/2022 | Lee et al. |

* cited by examiner

PUMPING LINERS WITH SELF-ADJUSTING PUMPING CONDUCTANCE

CROSS-REFERENCE TO RELATED APPLICATION

This application claims priority to U.S. Provisional Application No. 63/186,162, filed May 9, 2021, the entire disclosure of which is hereby incorporated by reference herein.

TECHNICAL FIELD

Embodiments of the present disclosure pertain to the field of electronic device manufacturing. More particularly, embodiments of the disclosure are directed to apparatus to improve flow control in processing chambers.

BACKGROUND

Various processing chambers, for example, Atomic Layer Deposition (ALD) and Chemical Vapor Deposition (CVD) chambers use a pump liner to confine the reactive gases to a reaction space adjacent the substrate surface. The pump liners help contain gases within the reaction space and allow rapid evacuation of gases from the reaction space. The pump liners include a plurality of openings to allow the reaction gases to flow through the liner to exhaust. The pump ports are closer to some of the openings than to others. For example, where the pump port is on one side of the ring-shaped liner, the openings in the liner immediately adjacent the pump port are closer than the openings on the opposite side of the liner. To compensate for the different distances, current processing chamber liners have variable size openings to choke the flow of gases toward the pumping ports. The openings closest to the pump port are smaller than the openings further away from the pump port.

Most processing chambers have asymmetric pumping since fore lines are located off-axis with respect to the process chamber. Some processes are highly sensitive to flow uniformity around the wafer. Therefore, pumping liner hole size optimization is a popular idea to improve flow uniformity around the wafer. Pumping liner hole sizes, e.g., diameter, are commonly optimized to change flow conductance based on simulation or actual wafer deposition mapping. Individualized pumping liner designs are expensive, have large lead times and need trial- and error tests. Even with the individualized approach, achieving pumping liner uniformity remains a goal rather than reality.

Therefore, there is a need in the art for apparatus and methods for providing a uniform flow of gases in the process volume.

SUMMARY

One or more embodiments of the disclosure are directed to pump liners for process chambers. The pump liners comprise a ring-shaped body with an annular wall enclosing a process region. The annular wall has an inner peripheral surface and an outer peripheral surface, an upper portion and a lower portion. A plurality of circumferentially spaced openings provide fluid communication through the annular wall between the process region and a region outside of the ring-shaped body. Each of the plurality of circumferentially spaced openings has a self-adjusting valve assembly.

Additional embodiments of the disclosure are directed to pump liners for process chambers. The pump liners comprise a ring-shaped body with an annular wall enclosing a process region. The annular wall has an inner peripheral surface and an outer peripheral surface, an upper portion and a lower portion. A plurality of circumferentially spaced openings provide fluid communication through the annular wall between the process region and a region outside of the ring-shaped body. Each of the plurality of circumferentially spaced openings has a self-adjusting valve assembly comprising, a valve housing having a sidewall and a distal end wall, the sidewall having an inner sidewall surface and an outer sidewall surface, the distal end wall having an inner end wall surface and an outer end wall surface and an aperture formed through the distal end wall; an inner cylinder within the valve housing, the inner cylinder having an inner cylinder sidewall with a cavity, the inner cylinder sidewall having an inner cylinder outer sidewall surface spaced from the inner sidewall surface of the valve housing to provide a flow path, and an inner cylinder inner sidewall surface bounding the cavity; a compression element within the cavity of the inner cylinder; and a slidable gate within the cavity of the inner cylinder, the slidable gate connected to the compression element and aligned with the aperture in the valve housing, wherein the compression element is configured to move the slidable gate between a full flow position allowing a flow of gas through the flow path and a sealed position preventing gas from flowing through the flow path.

Further embodiments of the disclosure are directed to self-adjusting valve assemblies comprising a valve housing, an inner cylinder, a compression element and a slidable gate. The valve housing has a sidewall and a distal end wall. The sidewall has an inner sidewall surface and an outer sidewall surface. The distal end wall has an inner end wall surface and an outer end wall surface and an aperture formed through the distal end wall. The inner cylinder is within the valve housing and has an inner cylinder sidewall with a cavity. The inner cylinder sidewall has an inner cylinder outer sidewall surface spaced from the inner sidewall surface of the valve housing to provide a flow path. An inner cylinder inner sidewall surface bounds the cavity. A compression element is within the cavity of the inner cylinder. The slidable gate is within the cavity of the inner cylinder and is connected to the compression element and aligned with the aperture in the valve housing. The compression element is configured to move the slidable gate between a full flow position allowing a flow of gas through the flow path and a sealed position preventing gas from flowing through the flow path.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limited in the figures of the accompanying drawings in which like references indicate similar elements.

DETAILED DESCRIPTION

Figure 1:
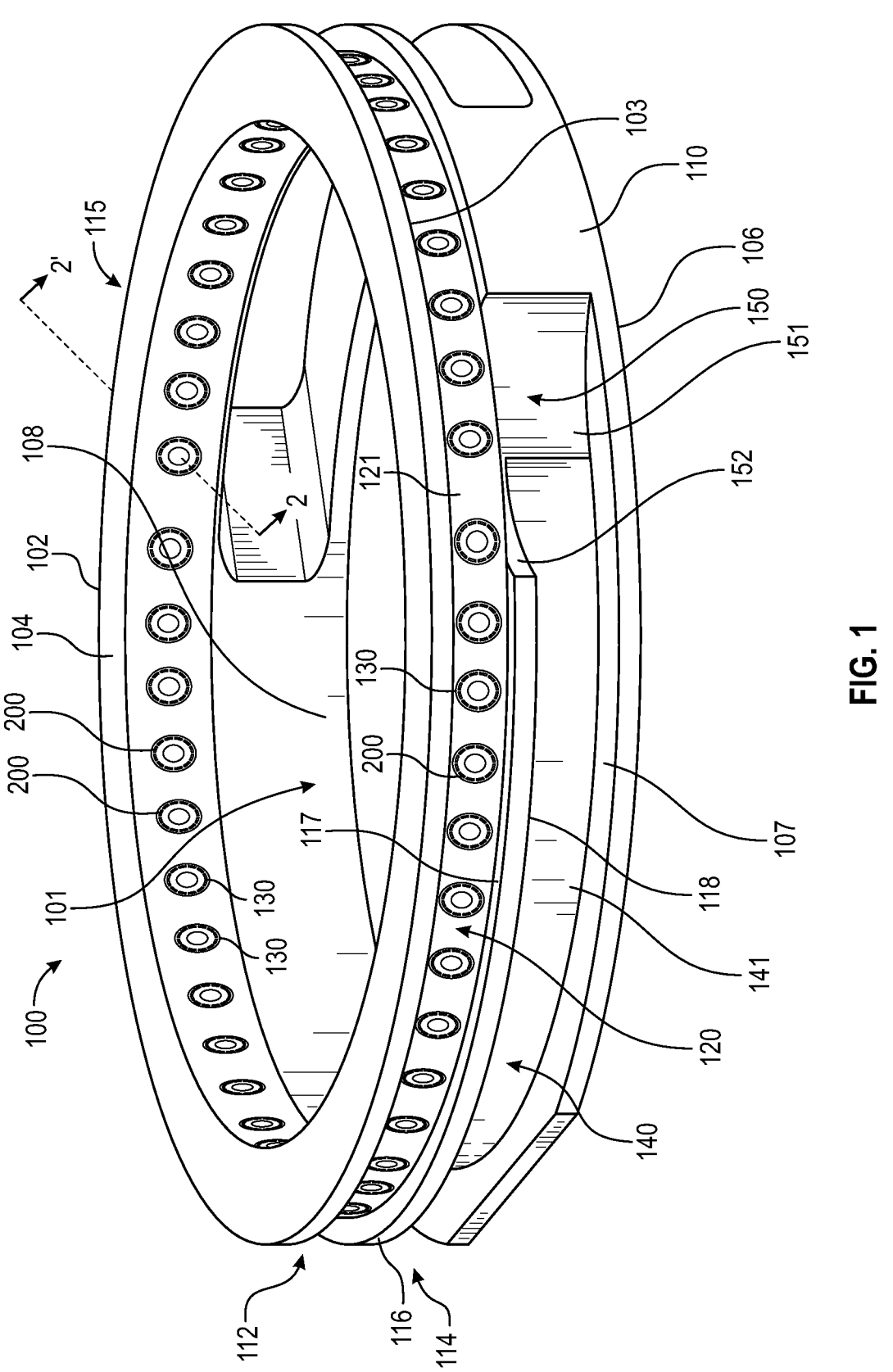
FIG. 1 illustrates an isometric view of a pump liner according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

One or more embodiments of the disclosure are directed to pumping liners with an in-situ self-flow adjusting capability to achieve uniform pumping around wafer regardless of chamber design, fore line location and/or process recipe. Some embodiments advantageously provide better precursor flow distribution for various process spacing between the showerhead and wafer.

One or more embodiments of the disclosure are directed to pumping liners with N numbers of valve assemblies. Each valve assembly comprises a spring loaded gate, an inner cylinder and a housing. The valve assembly can be removed and/or replaced during maintenance. At zero pressure drop within the gate, flow conductance is substantially uniform for all valves.

In some embodiments, the gate is actuated by a spring and self-controlled by pressure differentials. In some embodiments, gate conductance can be varied depending on resultant force between spring force and local fluid pressure. Usually, the pressure at the outlet side of the pumping liner is lower than the pressure within the pumping liner. Therefore, a pressure difference is generated across each gate which varies by location of the valve. Higher pressure difference will lead to lower gas flow conductance by pushing the gate toward the valve outlet. Since pumping throughput depends on pressure difference as well as flow conductance, the throughput value will be about the same for all valves regardless of location within the liner.

In some embodiments, the liner flow conductance is self-adjusting using spring actuation and local pressure difference in each valve. In some embodiments, local flow conductance is adjusted in-situ during processing. In some embodiments, the valve assembly is removable. In some embodiments, the spring force can be altered by the selection of spring and changing free length depending on chamber pressure.

FIG. 1 shows an isometric view of a pump liner 100 for a process chamber in accordance with one or more embodiment of the disclosure. The pump liner 100 includes a ring-shaped body 102 surrounding an inner portion 101. The ring-shaped body 102 has a top 104, bottom 106, inner peripheral wall 108 and an outer peripheral wall 110. The inner portion 101 is also referred to as a process region. The body 102 separates the process region (inner portion 101) from the region 115 outside of the ring-shaped body 102.

In the illustrated embodiment, the body 102 has an upper portion 112 and a lower portion 114 separated by a partition 116. In some embodiments, the upper portion and lower portion have a smooth transition within a distinct partition.

An annular upper channel 120 is formed in the upper portion 112 of the outer peripheral wall 110. The annular upper channel 120 of some embodiments extends around the body 102 for 360 degrees. The annular upper channel 120 shown in the Figures is bounded by a bottom face 103 of the top 104 of the body 102 and a top face 117 of the partition 116. The outer peripheral face (outer wall 121) of the upper channel 120 is recessed a distance from the outer peripheral wall 110 defining a depth of the upper channel 120.

The upper channel 120 has a plurality of circumferentially spaced openings 130 providing fluid communication between the annular upper channel 120 and the upper portion 112 of the inner peripheral wall 108.

The pump liner 100 of the illustrated embodiment includes a lower channel 140 in the lower portion 114 of the outer peripheral wall 110. The lower channel 140 is separated from the annular upper channel 120 by the partition 116. The height of the lower channel 140 is defined by the distance between the lower face 118 of the partition 116 and the upper face 107 of the bottom 106 of the body 203. The outer peripheral face (outer wall 141) of the lower channel 140 is recessed a distance from the outer peripheral wall 110 defining a depth of the lower channel 140.

The lower channel 140 is in fluid communication with the upper channel 120 through at least one passage 150 in the partition 116. The passage 150 can be any suitable shape and size to allow sufficient conduction of gases through the passage 150. In some embodiments, the passage 150 in the partition 116 is an arc-shaped segment 151 with a concave surface 152 facing the outer peripheral wall 110.

A plurality of circumferentially spaced openings 130 provide fluid communication through the annular wall (body 102) between the process region 101 and the region 115 outside the ring-shaped body 102. The openings 130 allow a gas within the inner portion 101 of the pump liner 100 to pass into the upper channel 120 to a region 115 outside the pump ring 100. The sizes of the openings 130 can be varied to change the conductance of gases through the openings 130 at various angular positions.

Figure 2:
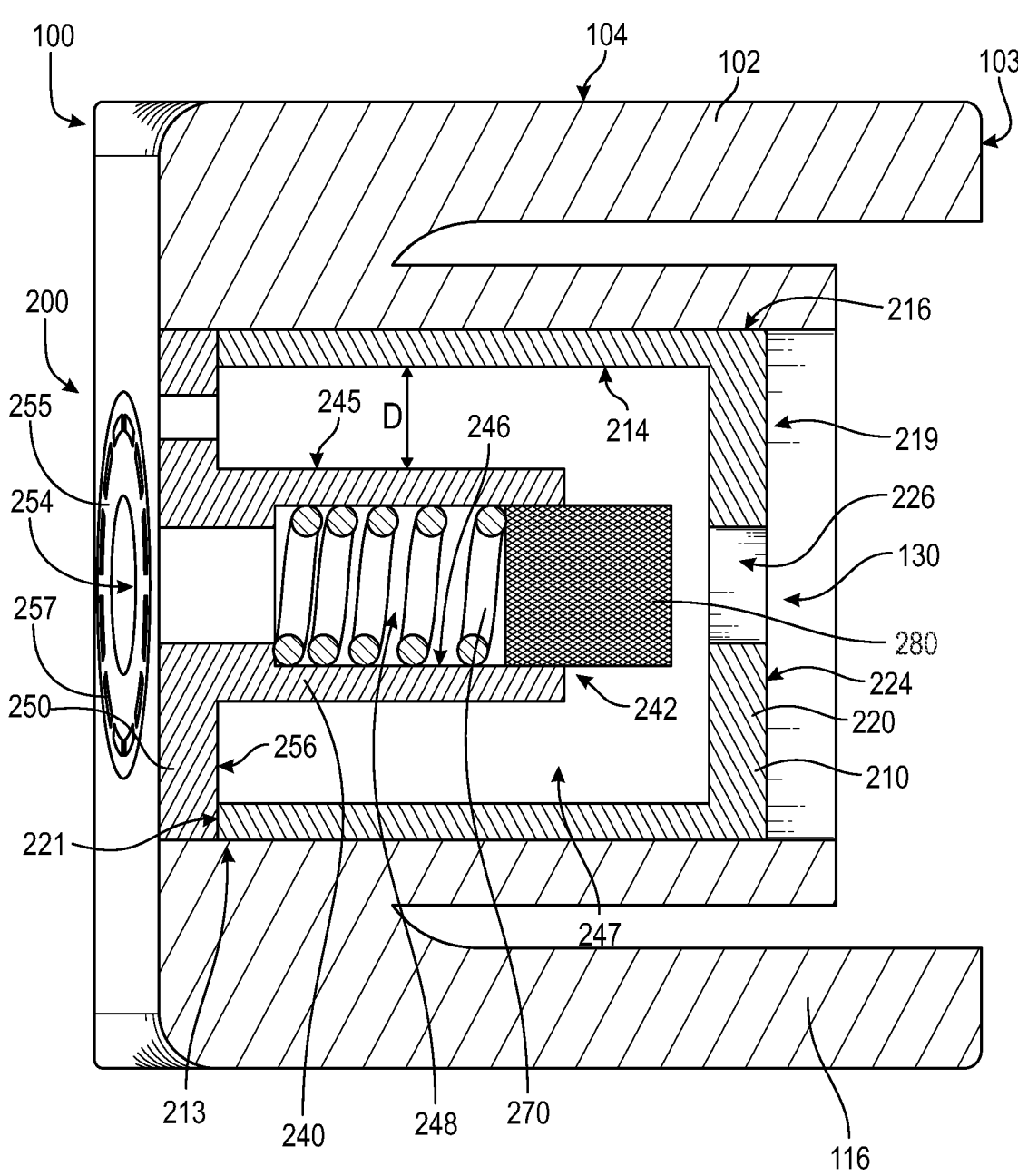
FIG. 2 illustrates a cross-sectional view of the pump liner of FIG. 1 taken along line 2-2'.
Figure 3:
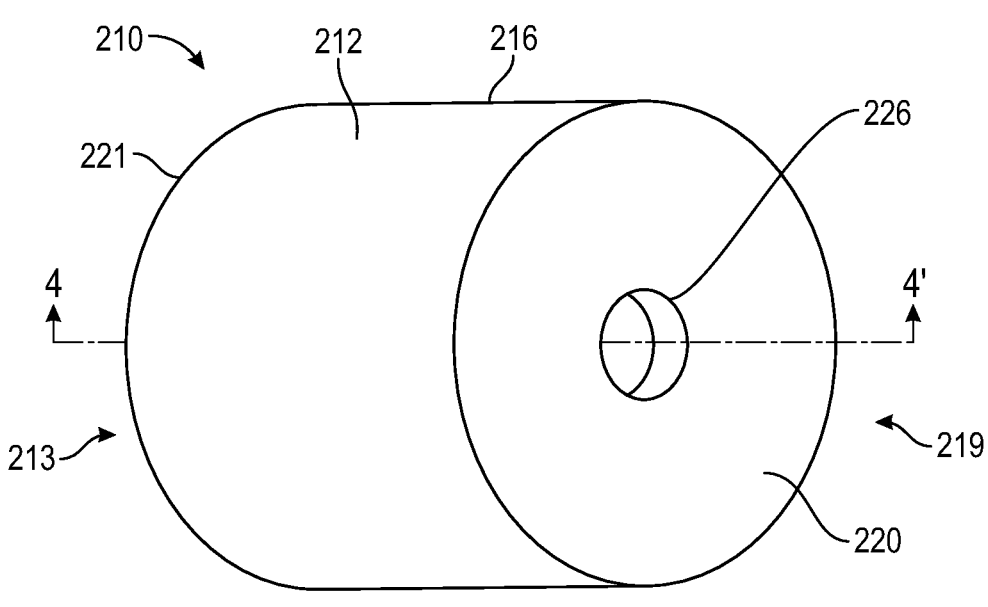
FIG. 3 illustrates an isometric view of a valve housing according to one or more embodiment of the disclosure.
Figure 4:
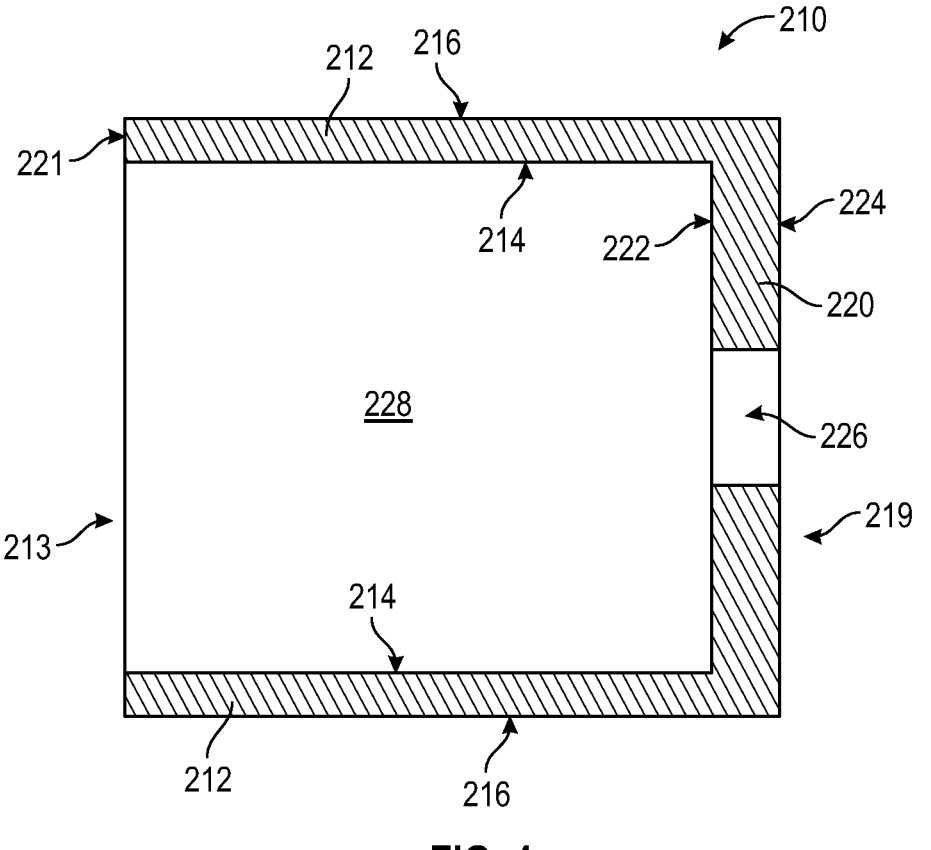
FIG. 4 illustrates a cross-sectional view of the valve housing of FIG. 3 taken along line 4-4'.
Figure 5:
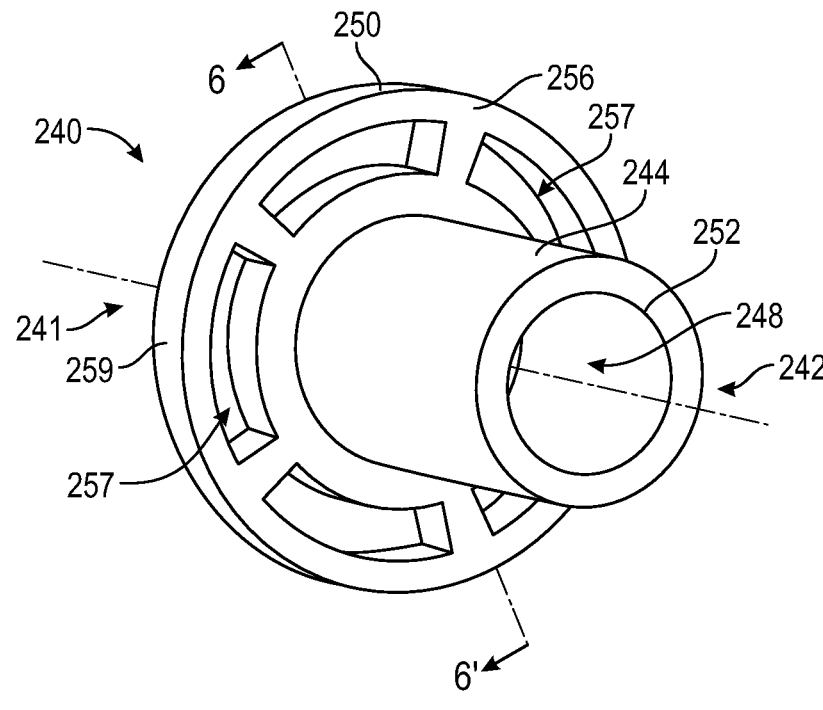
FIG. 5 illustrates an isometric view of an inner cylinder for a self-adjusting valve assembly according to one or more embodiment of the disclosure.
Figure 6:
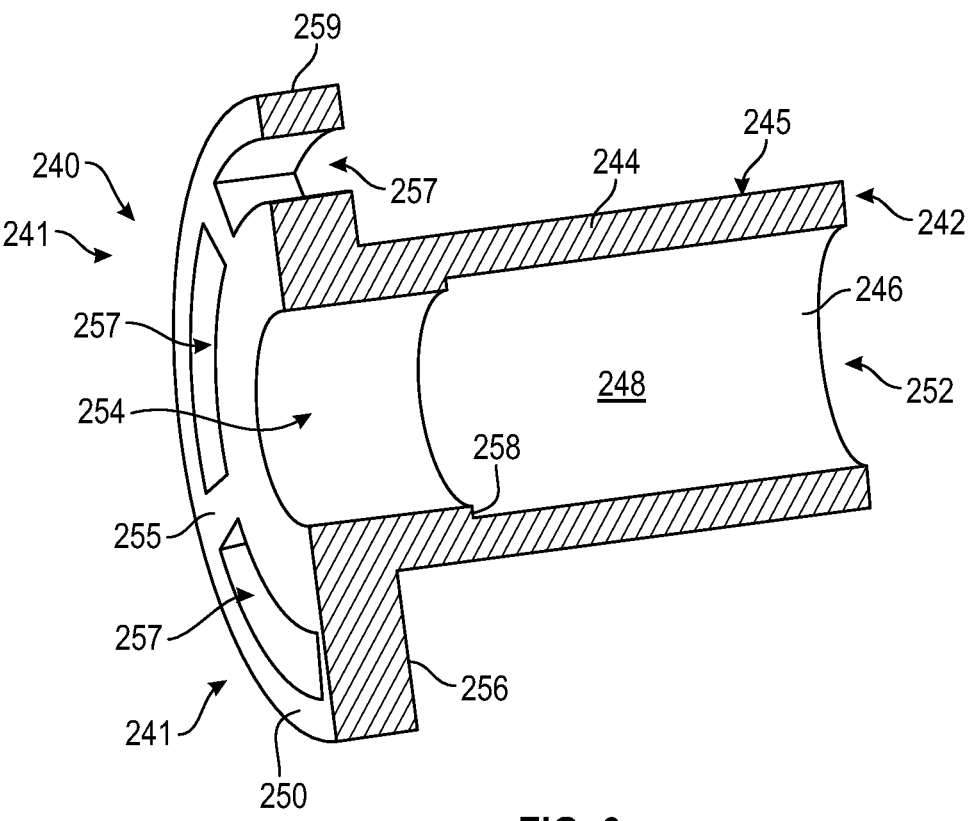
FIG. 6 illustrates a cross-sectional view of the inner cylinder of FIG. 5 taken along line 6-6'.

In some embodiments, each of the plurality of circumferentially spaced openings 130 has a self-adjusting valve assembly 200. Referring to FIGS. 2 through 6, the self-adjusting valve assembly 200 comprises a valve housing 210, inner cylinder 240, compression element 270 and slidable gate 280. FIG. 2 shows a cross-sectional view of the pump liner 100 taken along line 2-2' of FIG. 1. FIG. 3 shows an isometric view of a valve housing 210 and FIG. 4 shows a cross-sectional view of the valve housing 210 of FIG. 3 taken along line 4-4'. FIG. 5 shows an isometric view of an inner cylinder 240 and FIG. 6 shows a cross-sectional view of the inner cylinder 240 taken along line 6-6' of FIG. 5.

With reference to FIGS. 2 through 4, the valve housing 210 has a proximal end 213, sidewall 212 and a distal end 219 with distal end wall 220. The use of positional terms "proximal" and "distal" are relative and used for descriptive purposes only. As used herein, the proximal side of the components described below are closer to the inner portion 101 of the pump liner 100 than the distal side. The sidewall 212 has an inner sidewall surface 214 and an outer sidewall surface 216 which define the thickness of the valve housing 210 sidewalls. The distal end wall 220 has an inner end wall surface 222 and an outer end wall surface 224 that defined the thickness of the distal end wall 220. An aperture 226 is formed through the distal end wall 220. The aperture of some embodiments has a diameter in the range of 0.1 inches to 0.5 inches, or in the range of 0.2 inches to 0.4 inches.

The inner sidewall surface 214 and inner end wall surface 222 form the general boundary of the valve housing interior 228. The sidewall 212 illustrated in the Figures has a proximal sidewall face 221. The skilled artisan will recognize that the valve housing interior 228 is not fully enclosed so that a gas can enter the proximal end 213 of the valve housing 210 and exit the distal end 219 through aperture 226.

The valve housing 210 can be any suitable length, measured from proximal end to distal end. In some embodiments, the valve housing 210 has a length in the range of 0.6 inches to 2 inches. The valve housing 210 of some embodiments is friction fit into the opening 130 of the pump ring 100.

With reference to FIGS. 2, 5 and 6, the inner cylinder 240 is positioned within the interior 228 of the valve housing 210. The inner cylinder 240 has a proximal end 241 and a distal end 242. The inner cylinder 240 has a sidewall 244 with an inner cylinder outer sidewall surface 245 and an inner cylinder inner sidewall surface 246. The inner cylinder 240 is positioned so that the inner cylinder outer sidewall surface 245 is spaced a distance D from the inner sidewall surface 214 of the valve housing 210 to create a flow path 247. The inner cylinder inner sidewall surface 246 forms a boundary of cavity 248 in the inner cylinder 240. In some embodiments, as shown in the Figures, the distal end 242 of the inner cylinder 240 has an opening 252 and the proximal end 241 has opening 254.

In the illustrated embodiment, the inner cylinder 240 comprises a flange 250 at the proximal end 241. The flange 250 has a proximal face 255 and a distal face 256. The flange 250 at the proximal end 241 of the inner cylinder 240 comprises a center opening 254 with a plurality of outer openings 257 positioned around the center opening 254. The center opening 254 forms a fluid connection to the channel 248 formed along the length of the inner cylinder 240. The outer openings 257 form a fluid connection to the flow path 247 formed between the valve housing 210 and the inner cylinder 240. In use, gas can enter the center opening 254 and outer openings 257 from the proximal end 241 of the inner cylinder 240.

The inner diameter of the inner cylinder 240, measured from the inner cylinder inner sidewall surface 246 can remain uniform throughout the length of the inner cylinder 240, or can vary. In the illustrated embodiment, the inner diameter of the inner cylinder 240 changes. In some embodiments, the inner diameter of the inner cylinder is smaller at the proximal end 241 than at the distal end 242. In some embodiments, the inner diameter of the inner cylinder 240 has a definite transition to form a proximal facing ledge 258. In some embodiments, the inner diameter of the inner cylinder 240 has a smooth transition.

The valve housing 210 and the inner cylinder 240 can be connected or in contact by any suitable technique known to the skilled artisan. In some embodiments, as illustrated, the proximal sidewall face 221 of the valve housing 210 is connected to, or in contact with, the distal face 256 of the flange 250. In some embodiments, the proximal end 213 of the valve housing 210 encloses the flange 250. In some embodiments, the outer peripheral face 259 of the flange 250 is connected to, or in contact with, the inner sidewall surface 214 of the valve housing 210. As used in this manner, the terms "connected to" and "in contact with" are used interchangeably. The skilled artisan will recognize that "in contact with" is a less structured connection than "connected to". By way of example, the valve housing 210 of some embodiments is connected to the inner cylinder 240 by a weld or brazed. In some embodiments, the valve housing 210 is in contact with the inner cylinder 240 by a friction fit.

In some embodiments, the distance D between the inner cylinder outer sidewall surface 245 and the inner sidewall surface 214 of the valve housing 210 is in the range of 0.5 inches to 1 inch, or in the range of 0.6 inches to 0.8 inches.

A compression element 270 is positioned within the cavity 248 in the inner cylinder 240. The compression element 270 can be any suitable compressible/expandable material known to the skilled artisan that allows pressure within the inner portion 101 of the pump liner 100 to act on the slidable gate 280, as described further below. In some embodiments, the compression element 270 comprises a spring. In some embodiments, each of the compression elements 270 in each of the self-adjusting valve assemblies 200 comprise springs. In some embodiments, each of the compression elements 270 in each of the self-adjusting valve assemblies 200 have substantially the same spring force constant. As used in this manner, the term "substantially the same spring force constant" means that the spring force constant of any compression element 270 is within 10%, 5%, 2%, 1% or 0.5% of the average spring force constant of all compression elements 270.

In some embodiments, a proximal end 272 of the compression element 270 is in contact with the proximal facing ledge 258 of the inner cylinder 240. In some embodiments, the proximal end 272 of the compression element 270 is connected to the proximal facing ledge 258 of the inner cylinder 240.

In some embodiments, the distal end 272 of the compression element 270 is in contact with the proximal end 282 of the slidable gate 280. In some embodiments, the distal end 272 of the compression element 270 is connected to the proximal end 282 of the slidable gate 280.

The slidable gate 280 is positioned within the cavity 248 of the inner cylinder 240. The slidable gate 280 has a length—measured from the proximal end 282 to the distal end 284—that is sufficient to allow the slidable gate 280 to contact the inner end wall surface 222 of the valve housing 210 without falling out of the cavity 248. During use, at least some of the slidable gate 280 is within the cavity 248 of the inner cylinder 240 when the slidable gate is in the proximal-most position and the distal most position.

Figure 7:
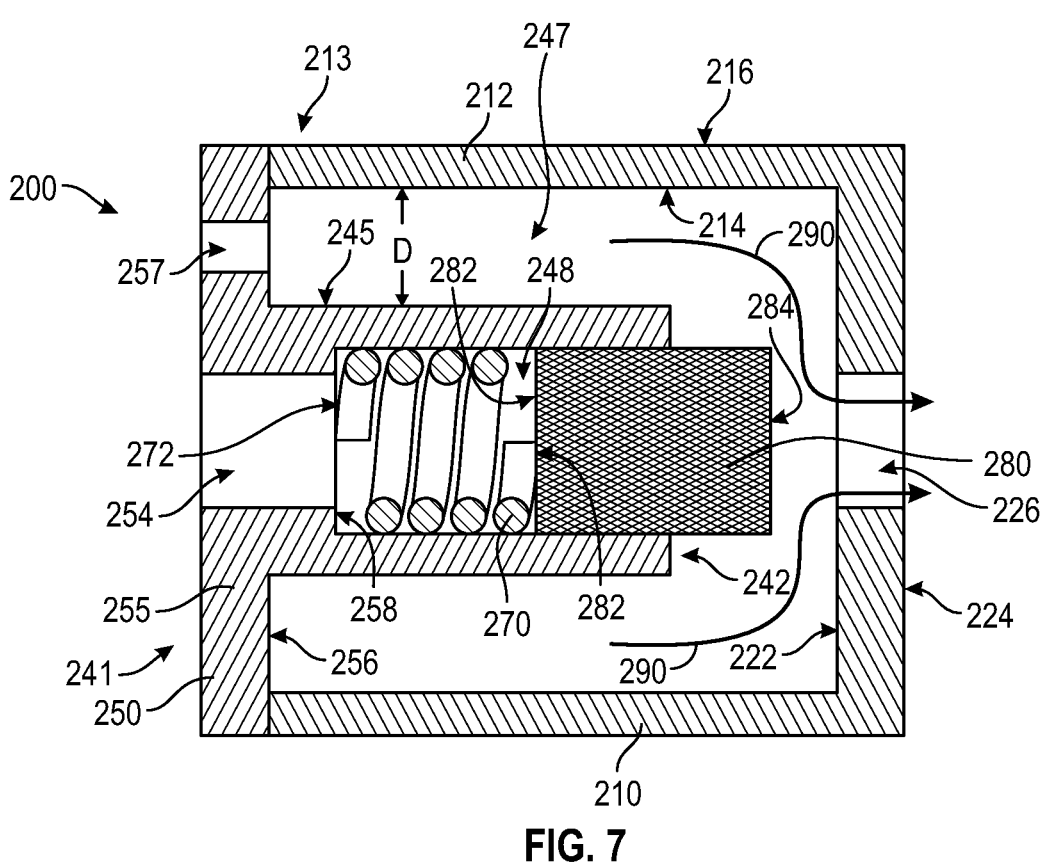
FIG. 7 illustrates a cross-sectional schematic view of a self-adjusting valve assembly in an open flow configuration according to one or more embodiment of the disclosure.
Figure 8:
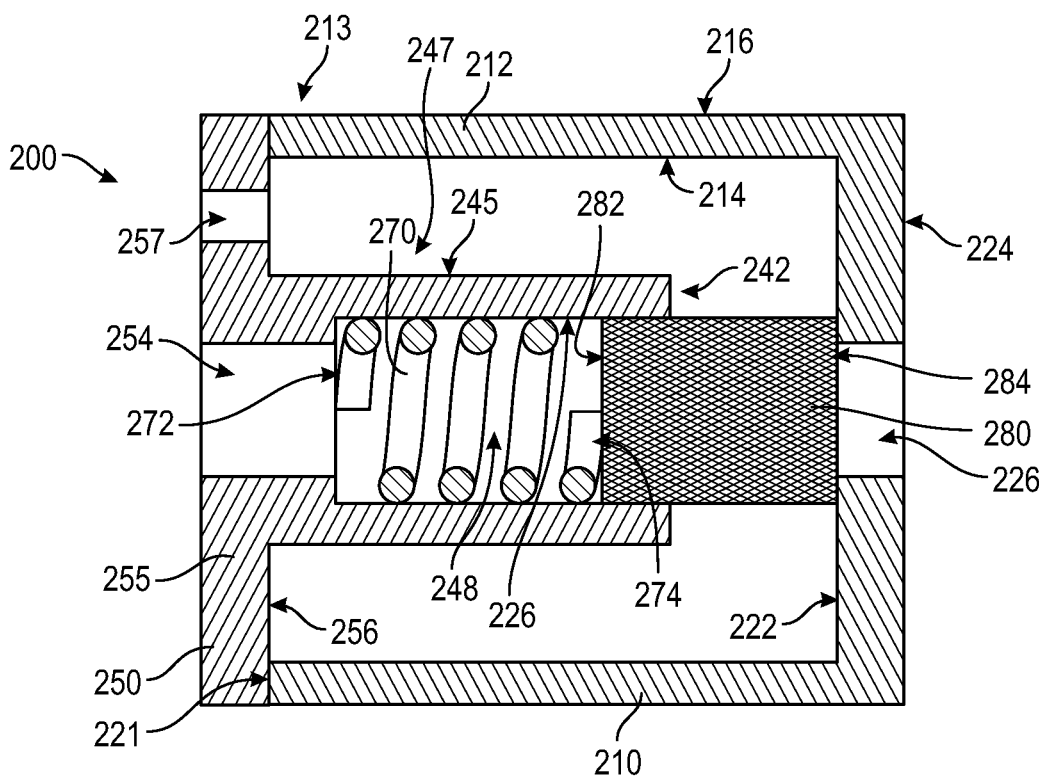
FIG. 8 illustrates a cross-sectional view of the self-adjusting valve assembly of FIG. 7 shown in the closed state.

In some embodiments, the compression element 270 is configured to move the slidable gate, or allow the slidable gate to move, between a full flow position (as shown in FIG. 7) allowing a flow 290 of gas through the flow path 247 and a sealed position (as shown in FIG. 8) preventing gas from flowing through the flow path 247. In some embodiments, when the slidable gate 280 is in the full flow position, the distal end 284 of the slidable gate is proximal of the distal end 242 of the inner cylinder 240, or even with the distal end 242 of the inner cylinder 240.

The aperture 226 of the valve housing 210 of some embodiments is aligned with the slidable gate 280. As used in this manner, "aligned with the slidable gate" means that when the slidable gate is in the distal-most position (i.e., contact the inner end wall surface 222 of the valve housing 210), the entire diameter of the aperture 226 is blocked by the distal end 284 of the slidable gate 280. Stated differently, the slidable gate 280 of some embodiments is configured to contact the inner end wall surface 222 of the valve housing 210 to form a fluid-tight seal.

In use, gas from the inner portion 101 of the pump liner 100 enters the plurality of outer openings 257 into the flow path 247 and through the aperture 226 in the valve housing 210. Gas from the inner portion 101 of the pump liner 100 also enters the center opening 254 into the cavity 248 in the inner cylinder 240. The pressure of the gas in the cavity 248 causes the slidable gate 280 to move distally or proximally within the inner cylinder 240. For example, if the pressure and flow through all of the valve assemblies are the same, the slidable gate 280 will be in an open or fully open position. As an imbalance in flow and/or pressure occurs, the valve assemblies in the higher flow/pressure regions will be choked off by distal movement of the slidable gate 280 so that the pressure outside of the pump liner 100 is substantially uniform.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A pump liner for a process chamber, the pump liner comprising:
   a ring-shaped body having an annular wall enclosing a process region, the annular wall having an inner peripheral surface, an outer peripheral surface, an upper portion, and a lower portion;
   a plurality of circumferentially spaced openings extending completely through the annular wall and providing fluid communication through the annular wall between the process region and a region outside of the ring-shaped body; and
   a plurality of self-adjusting valve assemblies, each of the plurality of circumferentially spaced openings having a self-adjusting valve assembly in contact with the outer peripheral surface of the annular wall,
   wherein each of the plurality of self-adjusting valve assemblies is configured to provide a substantially uniform pressure outside of the pump liner by self-adjusting to an open position when a pressure and a flow through the plurality of self-adjusting valve assemblies are the same and by self-adjusting to a sealed position when the pressure and/or the flow through the plurality of self-adjusting valve assemblies is imbalanced,
   wherein the self-adjusting valve assembly comprises:
   a valve housing having a sidewall and a distal end wall, the sidewall having an inner sidewall surface and an outer sidewall surface, the distal end wall having an inner end wall surface, an outer end wall surface and an aperture formed through the distal end wall;
   an inner cylinder within the valve housing, the inner cylinder having an inner cylinder sidewall with a cavity, the inner cylinder sidewall having an inner cylinder outer sidewall surface spaced from the inner sidewall surface of the valve housing to provide a flow path, and an inner cylinder inner sidewall surface bounding the cavity;
   a compression element within the cavity of the inner cylinder; and
   a slidable gate within the cavity of the inner cylinder, the slidable gate connected to the compression element and aligned with the aperture in the valve housing,
   wherein the compression element is configured to move the slideable gate between a full flow position allowing a flow of gas through the flow path and a sealed position preventing gas from flowing through the flow path, and the slidable gate moves in substantially an opposite direction from the flow of gas through the flow path.

2. The pump liner of claim 1, wherein the valve housing has a proximal end adjacent the outer peripheral surface of the annular wall.

3. The pump liner of claim 2, wherein the slidable gate is configured to contact the distal end wall of the valve housing adjacent the aperture to form a fluid-tight seal.

4. The pump liner of claim 2, wherein the inner cylinder has a flange at a proximal end of the inner cylinder, the flange having a proximal face and a distal face.

5. The pump liner of claim 4, wherein a proximal surface of the proximal end of the valve housing contacts the distal face of the flange.

6. The pump liner of claim 4, wherein the flange of the inner cylinder comprises a center opening with a plurality of outer openings positioned around the center opening.

7. The pump liner of claim 6, wherein the plurality of outer openings is aligned to allow a flow of fluid to pass through the flange into the flow path, and the center opening is aligned with the cavity in the inner cylinder to allow gas pressure from the process region to move the slidable gate.

8. The pump liner of claim 1, wherein the compression element comprises a spring.

9. The pump liner of claim 1, wherein each of the compression elements has a substantially same spring force constant.

10. The pump liner of claim 1, wherein the inner cylinder outer sidewall surface is spaced from the inner sidewall surface of the valve housing by an amount in the range of 0.5 inches to 0.8 inches.

11. The pump liner of claim 1, wherein the valve housing has a length in the range of 0.75 inches to 2 inches.

12. The pump liner of claim 1, wherein the ring-shaped body further comprises: a lower channel in the lower portion of the annular wall separated from an annular upper channel by a partition, the lower channel in fluid communication with the annular upper channel through at least one passage in the partition, and a slit valve opening in the lower portion of the annular wall extending from the inner peripheral surface to the outer peripheral surface.

13. The pump liner of claim 1, wherein there are in the range of 4 to 256 of the plurality of circumferentially spaced openings.

14. The pump liner of claim 13, wherein the plurality of circumferentially spaced openings are evenly spaced.

15. A self-adjusting valve assembly comprising:

a valve housing having a sidewall and a distal end wall, the sidewall having an inner sidewall surface and an outer sidewall surface, the distal end wall having an inner end wall surface, an outer end wall surface, and an aperture formed through the distal end wall;

an inner cylinder within the valve housing, the inner cylinder having an inner cylinder sidewall with a cavity, the inner cylinder sidewall having an inner cylinder outer sidewall surface spaced from the inner sidewall surface of the valve housing to provide a flow path, and an inner cylinder inner sidewall surface bounding the cavity;

a compression element within the cavity of the inner cylinder; and a slidable gate within the cavity of the inner cylinder, the slidable gate connected to the compression element and aligned with the aperture in the valve housing, wherein the compression element is configured to move the slidable gate between a full flow position allowing a flow of gas through the flow path and a sealed position preventing gas from flowing through the flow path, and the slidable gate moves in sustainably an opposite direction from the flow of gas through the flow path.

16. The pump liner of claim 1, wherein a flow conductance of the pump liner is self-adjusting using spring actuation and a local pressure difference in each valve assembly.

* * * * *